(12) United States Patent
Amir et al.

(10) Patent No.: US 11,355,403 B2
(45) Date of Patent: Jun. 7, 2022

(54) SEMICONDUCTOR DEVICE INCLUDING THROUGH-PACKAGE DEBUG FEATURES

(71) Applicant: Western Digital Technologies, Inc., San Jose, CA (US)

(72) Inventors: Nir Amir, Beit Hashmonai (IL); Avichay Hodes, Kfar Ben Nun (IL)

(73) Assignee: Western Digital Technologies, Inc., San Jose, CA (US)

( * ) Notice: Subject to any disclaimer, the term of this patent is extended or adjusted under 35 U.S.C. 154(b) by 164 days.

(21) Appl. No.: 16/021,687

(22) Filed: Jun. 28, 2018

(65) Prior Publication Data

US 2020/0006163 A1 Jan. 2, 2020

(51) Int. Cl.

| H01L 21/66 | (2006.01) |
| G01R 31/28 | (2006.01) |
| H01L 23/31 | (2006.01) |
| H01L 23/48 | (2006.01) |
| H01L 23/498 | (2006.01) |
| H01L 25/065 | (2006.01) |
| G01R 31/3185 | (2006.01) |

(52) U.S. Cl.
CPC .......... *H01L 22/32* (2013.01); *G01R 31/2886* (2013.01); *G01R 31/2896* (2013.01); *G01R 31/318597* (2013.01); *H01L 23/3107* (2013.01); *H01L 23/481* (2013.01); *H01L 23/49816* (2013.01); *H01L 25/0652* (2013.01); *H01L 2225/0651* (2013.01); *H01L 2225/06506* (2013.01); *H01L 2225/06562* (2013.01)

(58) Field of Classification Search
CPC ... H01L 22/32; H01L 23/3107; H01L 23/481; H01L 23/49816; H01L 25/0652; H01L 2225/06562; H01L 2225/06506; H01L 2225/0651; H01L 23/49811; H01L 23/3128; H01L 2225/06596; H01L 25/0657; H01L 2224/48145; H01L 2224/48227; H01L 2224/48091; G01R 31/2896; G01R 31/318597; G01R 31/2886; G01R 31/2884

See application file for complete search history.

(56) References Cited

U.S. PATENT DOCUMENTS

| 5,334,857 | A | * | 8/1994 | Mennitt | G01R 31/2884 257/48 |
| 6,010,915 | A | * | 1/2000 | Hammel | H01L 22/32 438/12 |
| 6,649,832 | B1 | * | 11/2003 | Brophy | H01L 23/04 174/535 |
| 6,740,984 | B2 | * | 5/2004 | Tay | G01R 1/0408 257/672 |
| 7,418,603 | B2 | | 8/2008 | Nakayama et al. | |

(Continued)

*Primary Examiner* — Nasima Monsur
(74) *Attorney, Agent, or Firm* — Vierra Magen Marcus LLP

(57) ABSTRACT

A semiconductor device includes through-package debug features enabling debug of a BGA package while mounted to a printed circuit board or other host device. In one example, the through-package debug features are filled or plated vias extending from a surface of the semiconductor device, through a device housing, down to test pads on the substrate. In another example, the through-package debug features are open channels formed from a surface of the semiconductor device.

13 Claims, 7 Drawing Sheets

(56) References Cited

U.S. PATENT DOCUMENTS

| | | | |
|---|---|---|---|
| 2007/0222005 A1* | 9/2007 | Schmitt | B81B 7/0051 |
| | | | 257/414 |
| 2008/0250377 A1 | 10/2008 | Bird et al. | |
| 2013/0221452 A1* | 8/2013 | Strothmann | H01L 24/96 |
| | | | 257/414 |
| 2015/0015288 A1* | 1/2015 | Ma | G01R 1/06738 |
| | | | 324/754.03 |
| 2016/0163609 A1 | 6/2016 | Rahman et al. | |
| 2016/0372405 A1* | 12/2016 | Broderick | H01L 23/49513 |
| 2017/0285097 A1 | 10/2017 | Pon et al. | |

* cited by examiner

SEMICONDUCTOR DEVICE INCLUDING THROUGH-PACKAGE DEBUG FEATURES

BACKGROUND

The strong growth in demand for portable consumer electronics is driving the need for high-capacity storage devices. Non-volatile semiconductor memory devices are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and computer SSDs.

While many varied packaging configurations are known, flash memory semiconductor devices may in general be fabricated as system-in-a-package (SIP) or multichip modules (MCM), where a plurality of semiconductor dies are mounted and interconnected to an upper surface of a substrate. The package may then be encapsulated and mounted onto a host device such as a printed circuit board. In so-called ball grid array (BGA) packages, solder balls may be provided on contact pads on a bottom surface of the package for physically and electrically connecting the package to the host device.

When semiconductor packages malfunction, the internal circuitry may be accessed and tested in a debug routine to determine the cause of the problem. The contact pads on the bottom surface of the package may include debug test pads, which may be accessed by a probe before or after connection of the solder balls onto the contact pads. The test pads are routed through the semiconductor package to debug pins on a controller within the package. The debug routine may identify a fault condition by supplying test data over the test pads and monitoring the output produced by the package.

While the use of test pads provides efficient access to the internal circuitry of the package, the test pads are no longer accessible once the package is mounted on the host device. A conventional solution to this problem is to route the test pads out to the circuit board of the host device. However, in this case, the debug routine is fully dependent on the host device, and test pads take up valuable space on the host device. It is also known to de-solder a semiconductor package from the host device to perform debug, but such processes are time consuming and can result in further damage to the package.

DETAILED DESCRIPTION

The present technology will now be described with reference to the figures, which in embodiments, relate to a semiconductor device including through-package debug features enabling debug of a BGA package while mounted to a printed circuit board or other host device. In one embodiment, the through-package debug features comprise filled or plated vias extending from a surface of the semiconductor device, through a device housing, down to test pads on the substrate. In this configuration, debug probes may engage the debug features on the surface of the semiconductor device to perform the debug routine. In another embodiment, the through-package debug features comprise open channels formed from a surface of the semiconductor device. In this configuration, debug probes may extend into the open channels and engage test pads on a surface of the substrate to perform the debug routine.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±2.5% of a given dimension.

Figure 1:
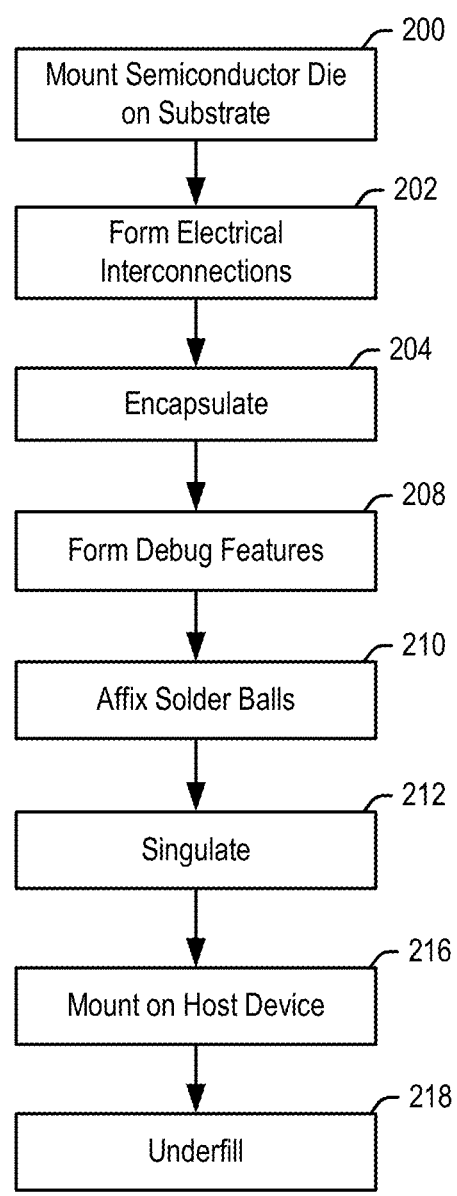
FIG. 1 is a flowchart of the overall fabrication process of a semiconductor device according to embodiments of the present technology.

An embodiment of the present technology will now be explained with reference to the flowchart of FIG. 1 and the views of FIGS. 2 through 13. Referring initially to the flowchart of FIG. 1 and the side view of FIG. 2, a semiconductor device 100 may be formed by initially mounting one or more semiconductor dies 102, 104 on a substrate 106 in step 200. The semiconductor device 100 may be batch processed along with a plurality of other devices 100 on a substrate panel to achieve economies of scale. The number of rows and columns of devices 100 on the substrate panel may vary.

Figure 2:
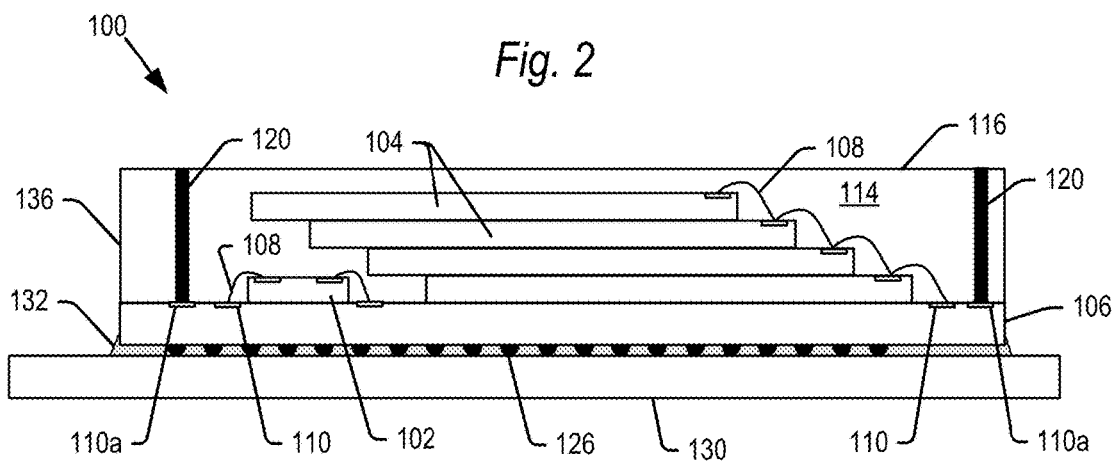
FIG. 2 is a side view of a semiconductor device including test pins according to embodiments of the present technology.

The substrate panel begins with a plurality of substrates 106 (again, one such substrate is shown in FIG. 2. The substrate 106 may be a variety of different chip carrier mediums, including a printed circuit board (PCB), a leadframe or a tape automated bonded (TAB) tape. A conductive pattern of vias, leads and pads are formed on surfaces of the substrate 106 and through the substrate 106 as explained in greater detail below. The semiconductor dies may include a controller die 102, such as for example an ASIC, affixed to a surface of the substrate 106. The semiconductor dies may further include memory dies 104. The one or more memory dies 104 may be for example flash memory chips, such as 2D NOR or NAND semiconductor die or 3D BiCS (Bit Cost Scaling) semiconductor die, though other types of memory die are contemplated. The one or more semiconductor dies 104 may be other types of semiconductor dies in further embodiments, including for example RAM such as an SDRAM, DDR SDRAM, LPDDR and GDDR.

The side view of FIG. 2 shows a particular number and configuration of semiconductor dies 102, 104 on substrate 106. However, it is understood that the present technology may be used with any of a wide variety of other numbers, configurations and combinations of semiconductor dies. In embodiments, the semiconductor dies 102, 104 form a multichip or SIP module, but other types of semiconductor modules are contemplated.

In step 202, electrical interconnections may be formed electrically coupling semiconductor dies 102, 104 to each other and to substrate 106. In one embodiment, the electrical interconnections may comprise wire bonds 108. The wire bonds 108 may be formed between bond pads on the controller die 102 and contact pads 110 on the substrate 106 to electrically couple the controller die 102 to the substrate 106. The wire bonds 108 may also be formed between bond pads on the different levels of memory dies 104 and contact pads 110 on the substrate 106 to electrically couple the memory dies 104 to each other and to the substrate 106.

It is understood that other electrical interconnections may be used to connect semiconductor dies 102, 104 to each other and/or to substrate 106. For example, in one further embodiment, the semiconductor device 100 may include a semiconductor die, such as controller die 102, including a pattern of solder balls on a surface to mount the semiconductor die to the substrate in a flip-chip bond process. In a further embodiment, the semiconductor dies 102 and/or 104 may be electrically coupled to each other and the substrate using through-silicon vias (TSVs).

In step 204, the semiconductor die and electrical interconnections may be encased in a housing 114. In embodiments, the housing 114 may comprise a molding compound formed of any of a variety of thermoplastic or thermosetting resins such as an epoxy resin available for example from Sumito Corp. or Nitto Denko Corp., both having headquarters in Japan. Other molding compounds from other manufacturers are contemplated. The molding compound may be applied according to various processes, including by FFT (flow free thin) molding, transfer molding or injection molding techniques. The housing 114 may be other types of housings in further embodiments, including for example a lid formed of plastics, polymers and/or metals.

In accordance with aspects of the present technology, debug features may be formed in semiconductor device 100 in step 208. In one embodiment, the debug features may comprise test pins 120 extending from an external surface 116 of the semiconductor device 100, through the housing 114, and into contact with a set of contact pads 110*a*, referred to herein as test pads 110*a*, on the substrate.

In embodiments, the test pins 120 may comprise plated or filled vias formed by initially etching, drilling, lasing or otherwise forming holes through housing 114 down to the substrate 106, above the test pads 110*a*. In particular, although encased within housing 114, the positions of the test pads 110*a* are known on the substrate 106, and these known positions may be used as a starting point for forming the holes in the housing 114 for test pins 120.

The holes may next be lined with a barrier against diffusion of a later-applied metal, as explained below. In an embodiment, the barrier layer may be formed of one or more layers of titanium, titanium nitride, tantalum, tantalum nitride, or the like. The barrier layer may be formed through physical vapor deposition (PVD), chemical vapor deposition (CVD) or atomic layer deposition (ALD), although other techniques could alternatively be used. The barrier layer may in turn be lined with a seed layer. The seed layer may be deposited by PVD or CVD, though it may be deposited by other techniques in further embodiments. The seed layer may be formed of copper, aluminum, tin, nickel, gold, alloys thereof or other materials.

A conductive material may then be plated onto the seed layer. The conductive material may comprise copper, although other suitable materials such as aluminum, tin, nickel, gold, doped polysilicon, and alloys or combinations thereof may be used. The conductive material may be formed by electroplating copper or other conductive material onto the seed layer. The material may be plated to completely fill the vias. Once the vias have been filled with the conductive material, excess material extending beyond the surface 116 of semiconductor device 100 may be removed through a planarization process such as chemical mechanical polishing (CMP) or other processes.

While the test pins 120 may be formed as filled or plated vias as explained above, the test pins 120 may be formed by other methods in further embodiments. In one such further embodiment, before the housing 114 is formed in step 204, conductive columns may be affixed, as by soldering, onto the test pads 110*a*. The conductive columns may be formed for example of copper, and may extend to a height above the substrate so that, when the housing 114 is formed in step 204, the housing is formed around the conductive columns and the conductive columns terminate at the surface 116 of the semiconductor device 100.

Figure 3:
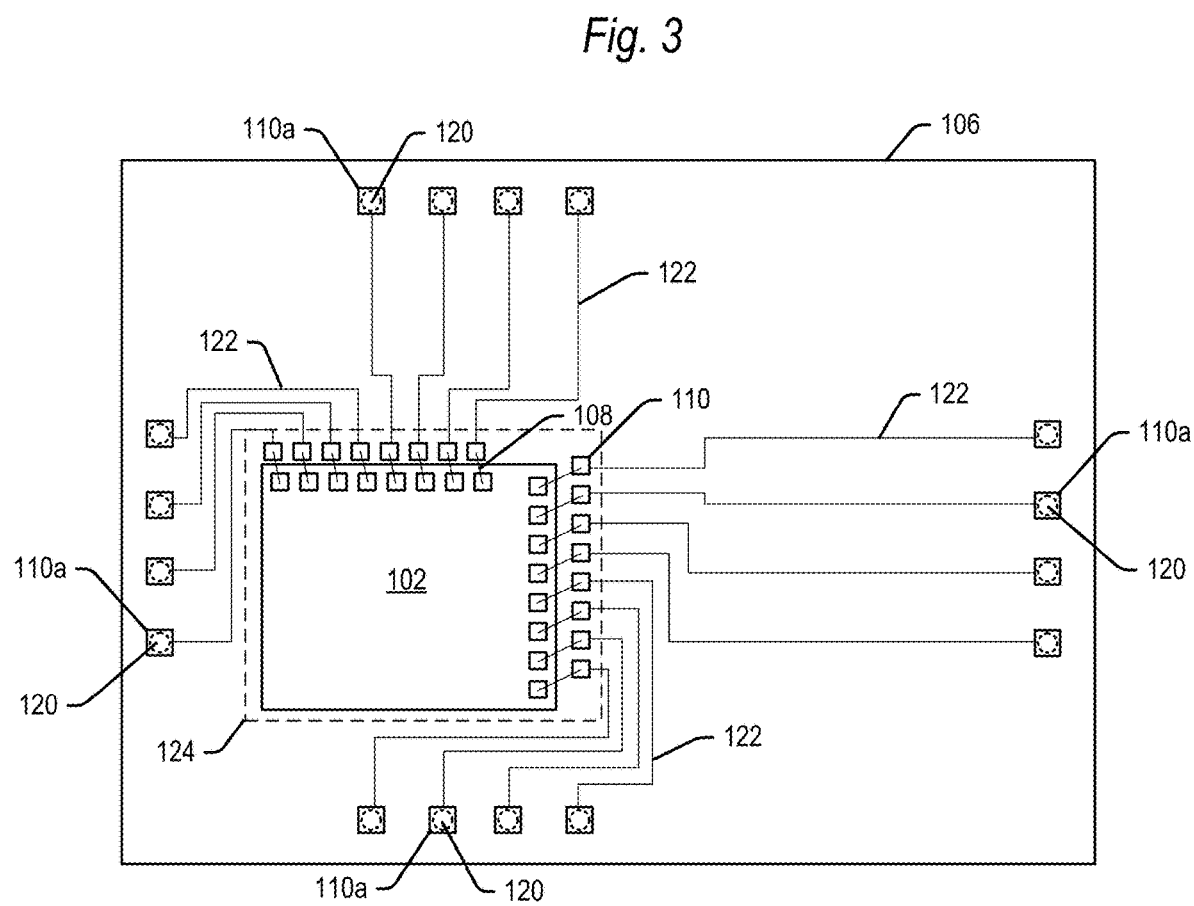
FIG. 3 is a top view showing routing of test pads to a controller die on a substrate according to embodiments of the present technology.

FIG. 3 is a top view of the substrate 106 showing one configuration of test pins 120 (shown in phantom) on test pads 110*a*. FIG. 3 also shows a configuration of traces 122 electrically coupling the test pads 110*a* with contact pads 110 adjacent the controller die 102. The contact pads 110 and bond pads on controller die 102 are shown for simplicity, and there may be more contact pads 110 and bond pads on controller die 102 in further embodiments. The contact pads 110 adjacent the controller die 102 may in turn be electrically coupled to the controller die 102 via wire bonds 108 as described above. The particular pattern of traces 122 are shown by way of example only, and it is understood that the test pads 110*a* may be electrically coupled to the contact pads 110 adjacent the controller die 102 by any of a wide variety of other configurations of traces 122.

The semiconductor die 102, 104 may be mounted on the substrate 106 in one or more keep-out areas 124 on the substrate 106 (shown in phantom lines in FIG. 3). For example, the semiconductor die 102 may be mounted in first keep-out area, and the one or more semiconductor dies 104 may be mounted in a second keep-out area. In further embodiments, there may be a single keep-out area in which both semiconductor dies 102 and 104 are mounted. The through-package debug features are formed through the housing 114 of the semiconductor device down to the substrate 106. In embodiments, the through-package debug features are formed outside of the one or more keep-out areas 124, so that they do not contact the semiconductor dies 102 or 104 when the debug features are formed.

Figure 4:
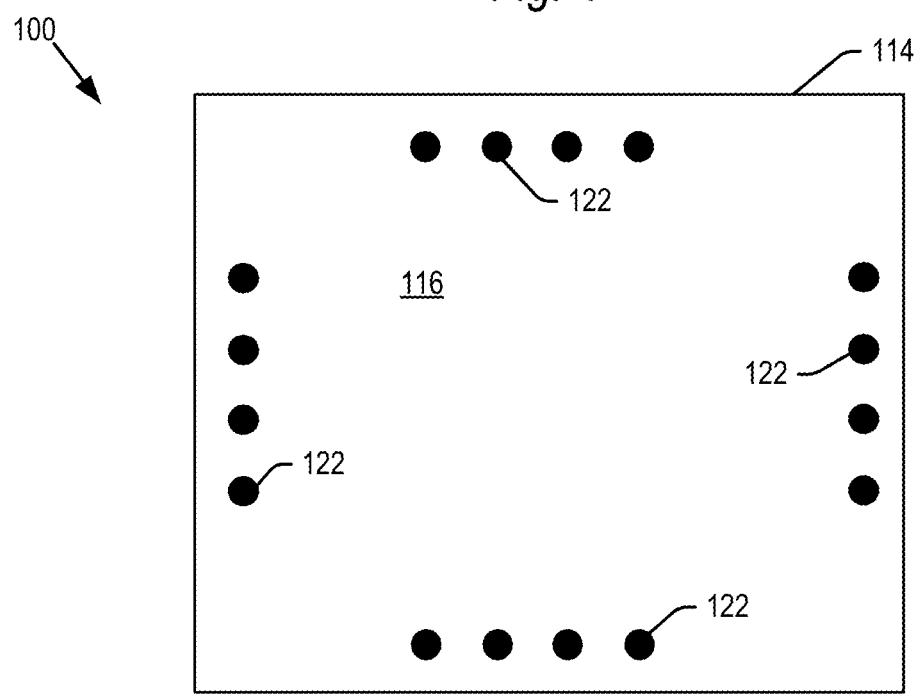
FIG. 4 is a top view of a semiconductor device including test pins according to embodiments of the present technology.

FIG. 4 is a top view of semiconductor device 100 showing the test pins 120 exposed in an upper surface 116 of the housing 114. As will be explained, the test pins 120 may be formed in a variety of other numbers and/or patterns in further embodiments. The test pins 120 are configured to receive an automated surface probe (not shown) for inputting test data to the circuitry within semiconductor device 100, and receiving an output from the circuitry based on the test data, as explained below. The surface probe is configured to engage the top surface 116 of the semiconductor device 100 at the test pins 120 to input the test data and to receive the output data. The automated surface probe may include multiple heads for contacting multiple test pins 120 simultaneously. Alternatively, the automated surface probe may include only a single head for contacting a single test pin 120 at a time.

Figure 5:
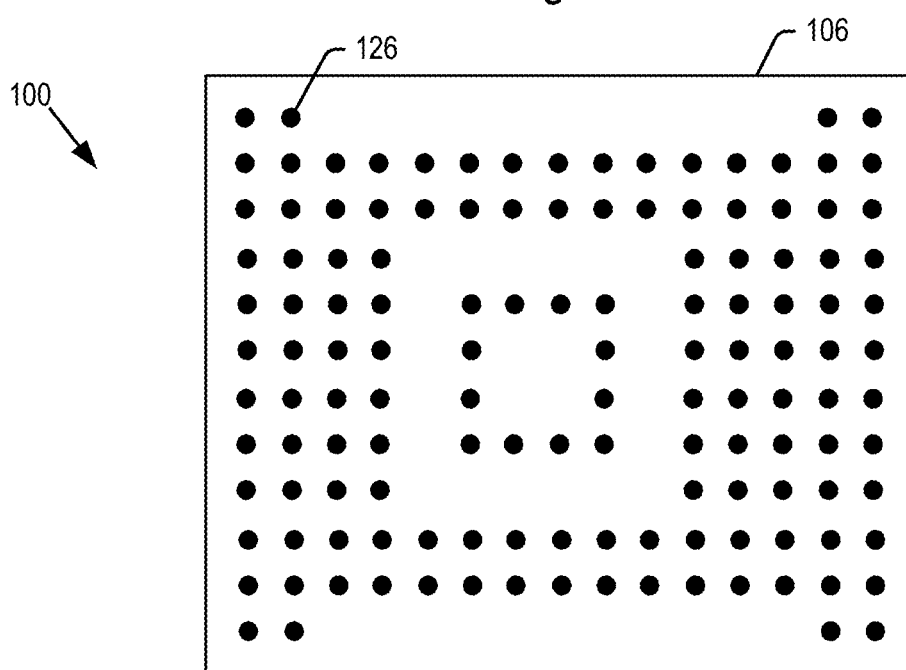
FIG. 5 is a bottom view of a semiconductor device including solder balls according to embodiments of the present technology.
Figure 6:
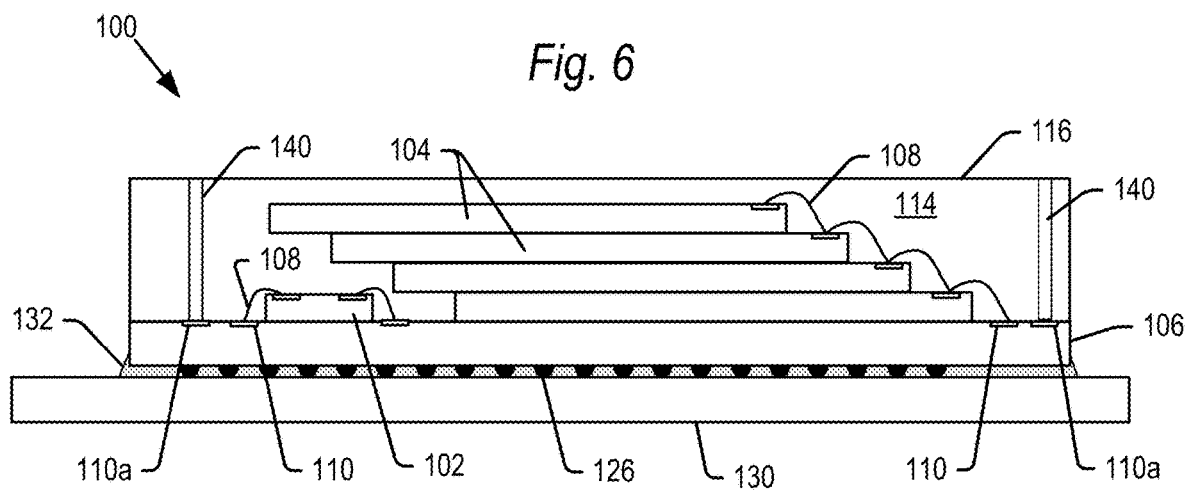
FIG. 6 is a side view of a semiconductor device including channels open to test pads on the substrate according to embodiments of the present technology.

Before or after the formation of the debug features in step 208, solder balls 126 may be formed on a bottom surface of the semiconductor device 100 in step 210 (opposite surface 116 of the housing 114). Solder balls 126 may be used to affix the semiconductor device 100 to a host device 130, as explained below. FIG. 5 is a bottom view of the semiconductor device 100 including a pattern of solder balls 126. The particular number and pattern of solder balls 126 shown in FIGS. 2 and 5 is the way of example only, and the solder balls 126 may be provided in a wide variety of other numbers and patterns in further embodiments.

As noted, the semiconductor device 100 may be fabricated on a panel containing several semiconductor devices 100 for economies of scale. After formation of the debug features and solder balls, the respective devices 100 may be singulated in step 212 from the panel to form the finished semiconductor device 100 shown in FIG. 2. The semiconductor device may thereafter be mounted on a host device 130 in step 216, as shown for example in the side view of FIG. 2. The solder balls 126 on the bottom surface of the semiconductor package 100 may mate with a like a pattern of pads on the host device. The solder balls may be melted in a reflow process to physically and electrically couple the semiconductor device 100 to the host device 130. The host device 130 may for example be a printed circuit board (PCB), but may be other types of devices in further embodiments.

After mounting on the host device 130, a space between the semiconductor device 100 and host device 130 may be under-filled with an epoxy or other resin or polymer 132 (FIG. 2) in step 218. The under-fill material 132 may be applied as a liquid which then hardens into a solid layer. This under-fill step protects the electrical connections between the semiconductor device 100 and host device 130, and further secures the semiconductor device 100 to the host device 130.

In the embodiment shown in FIGS. 2 and 4, the through-package debug features are in the form of test pins 120. A further embodiment of the present technology will now be described with reference to the side view of FIG. 6 and the top view of FIG. 7, in which the through-package debug features are in the form of open channels 140. Other than the debug features, the components and assembly of the semiconductor device 100 shown in FIGS. 6 and 7 may be in accordance with any of the embodiments described above.

In embodiments, the channels 140 may be openings formed by etching, drilling, lasing or otherwise forming holes through housing 114 down to the substrate 106, above the test pads 110a. As used herein, the channels 140 are "in contact" with the test pads 110a, in that the test pads 110a may be exposed at the bottom of channels 140. In embodiments, the sidewalls of the channels 140 may be the material of the housing 114, such as for example molding compound. In further embodiments, a barrier, seed and/or conductive layer may be plated onto the sidewalls of the channels 140 so as to leave a central opening within the plated channel. In embodiments including plated channel sidewalls, the plating may extend the full depth of the housing 114 (i.e., from the surface 116 down to the substrate 106). In further embodiments, the plating on the channel sidewalls may extend less than the full depth of the housing 114, and to be positioned either near the substrate 106, or near the surface 116.

Figure 7:
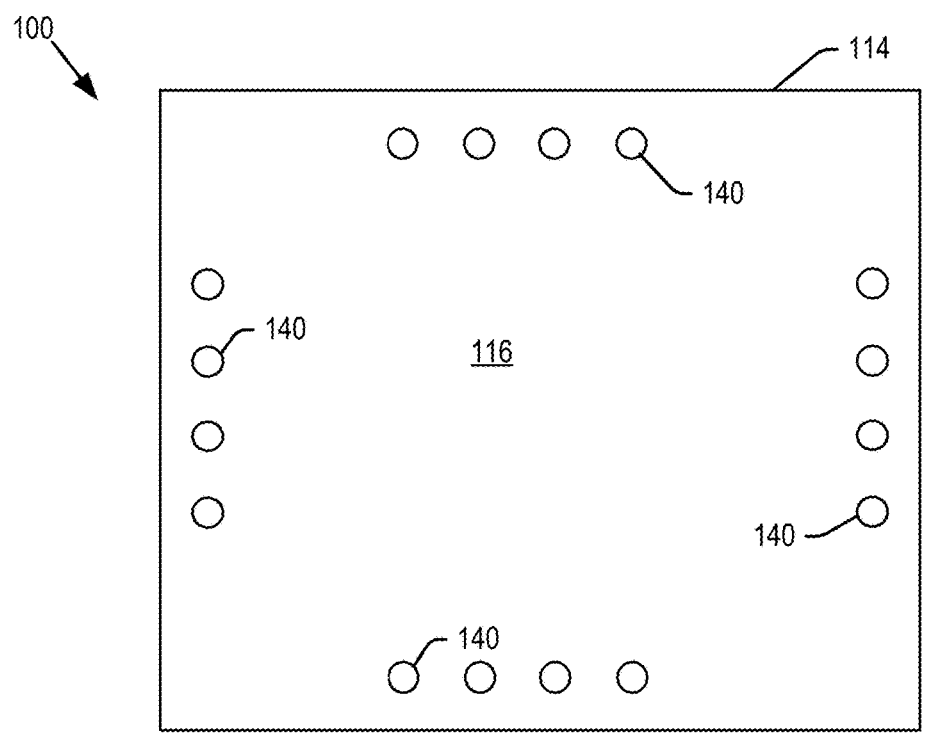
FIG. 7 is a top view of a semiconductor device including channels according to embodiments of the present technology.

FIG. 7 is a top view of semiconductor device 100 showing the channels 140 exposed in an upper surface 116 of the housing 114. As will be explained, the channels 140 may be formed in a variety of other numbers and/or patterns in further embodiments. The channels 140 are configured to receive an automated pin probe (not shown) for inputting test data to the circuitry within semiconductor device 100, and receiving an output from the circuitry based on the test data, as explained below.

The pin probe may be configured to extend into the channels 140, down into contact with the test pads 110a on the substrate 106 of the semiconductor device 100 to input the test data and to receive the output data. In embodiments where the channels 140 are at least partially plated, the channels 140 and pin probe may be configured so that the pin probe extends into the channels 140 at least until the pin probe contacts the plated portions of the channels 140. The automated pin probe may include multiple heads for extending into multiple channels 140 simultaneously. Alternatively, the automated pin probe may include only a single head for extending into a single channels 140 at a time.

The debug features including test pins 120 and channels 140 may be used to implement any of a wide variety of standard and/or customized debug protocols. In one embodiment which will now be described with reference to the schematic diagram of FIG. 8, the test pads 110a, connected to the pins 120 or channels 140, are coupled to a debug circuit within the controller 102. The debug circuit may be configured to operate in accordance with the IEEE 1149.1 Standard—Test Access Port and Boundary Scan Architecture specification, the entire disclosure of which is incorporated herein by reference.

Figure 8:
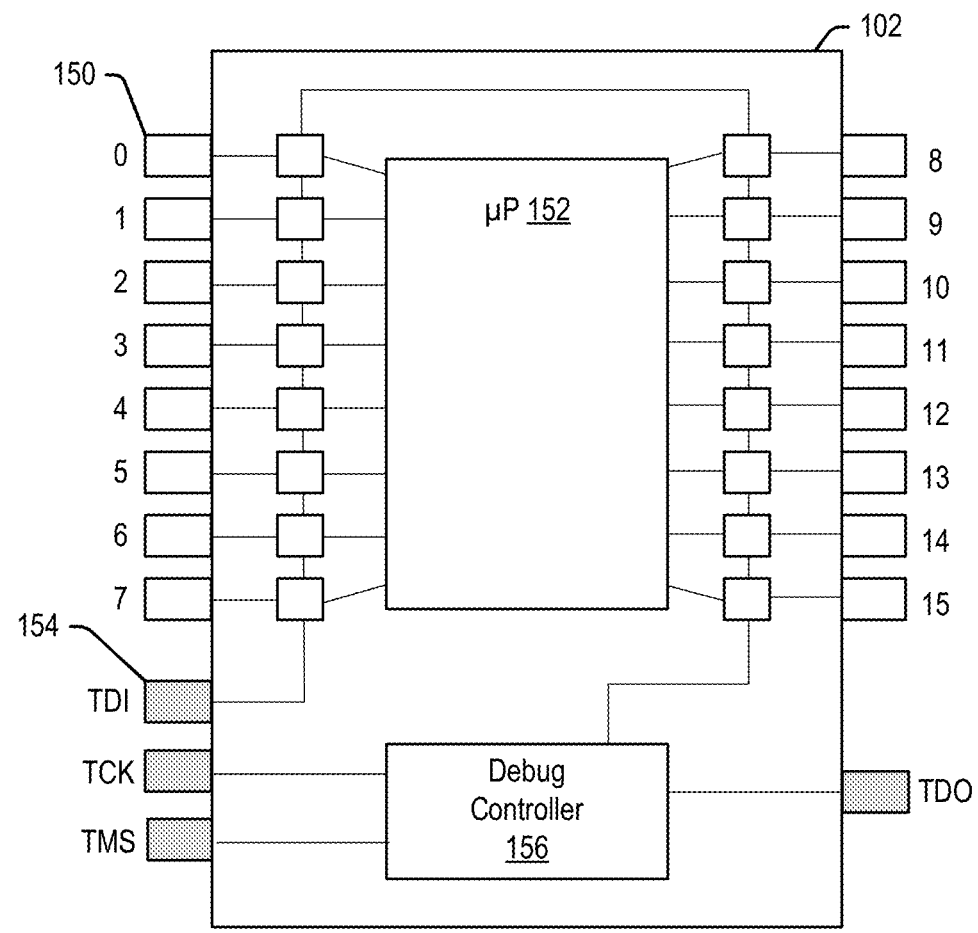
FIG. 8 is a top view of a controller including debug pins and debug processor according to embodiments of the present technology.

The controller die 102 may control read/write operations for the memory die 104. During normal operations, input/output (I/O) for controller die 102 occurs over the pins 150 of the controller 102. Pins 0-15 are shown in FIG. 8, but this example is for illustrative purposes only and there may be more or less pins 150 in further embodiments. I/O for controller die 102 may be processed by a microprocessor 152.

In one embodiment, the controller 102 further includes a debug circuit comprising one or more debug ports, or pins, 154, and a debug controller 156. The debut pins 154 may include a Test Mode Select (TMS) pin, a Test Clock (TCK) pin, a Test Data In (TDI) pin and Test Data Out (TDO) pin. The TMS pin is in general controls the operation of the debug routine, for example setting the debut algorithm to be run and test data to be provided. A signal over the TMS pin may initiate a selected debug routine, whereby the debug controller 156 interrupts input data from pins 150. At that point, input test data is instead shifted into the microprocessor 152 from the TDI pin. The input test data is processed by the microprocessor 152 (possibly involving read/write with the memory die 104). The result is output to the debug controller 156 which in turn outputs the processed test data over the TDO pin. The TCK pin may provide a clock signal for synchronizing the input to the TDI pin and output from the TDO pin. The debug routine may continue to run until a signal over the TMS pins returns normal I/O over pins 150 in the controller die 102.

The TMS, TCK, TDI and TDO pins may be coupled to the test pads 110a and to test pins 120 (in embodiments including pins 120). Test data for the debug circuit may be supplied to the test pads 110a from the debug probes (surface or pin) as described above. The TMS, TCK, TDI and TDO pins may be used with test data to check that the semiconductor device 100 operates as specified in its design. Where a fault condition is detected, the output from the debug routine over the TDO pin may be analyzed to determine the cause of the fault condition.

The debug routine described with respect to FIG. 8, and in IEEE 1149.1 Standard in general, is one example of how the debug circuit receives and outputs test data via the test pins 120 or channels 140. It is understood that the debug circuit may include more, less or different pins than the TMS, TCK, TDI and TDO pins, and may receive and output test data via the test pins 120 or channels 140 according to any of a wide variety of other standards or customized debug routines in further embodiments.

Figure 9:
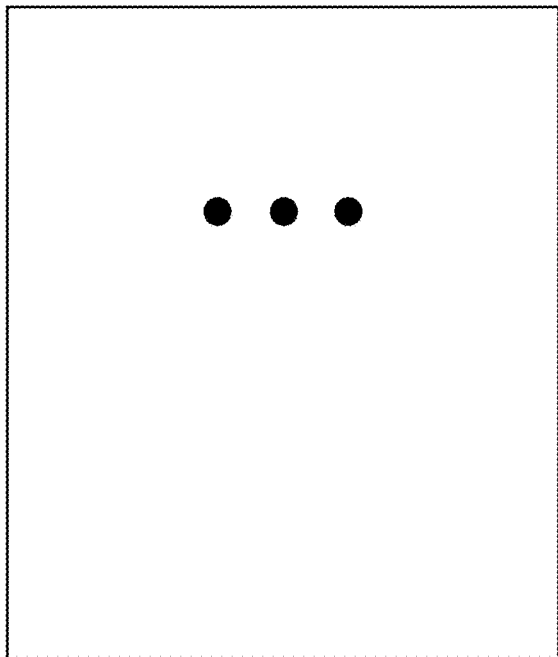
FIGS. 9-11 are top views of semiconductor devices including various numbers and patterns of test pins in an upper surface according to further embodiments of the present technology.
Figure 10:
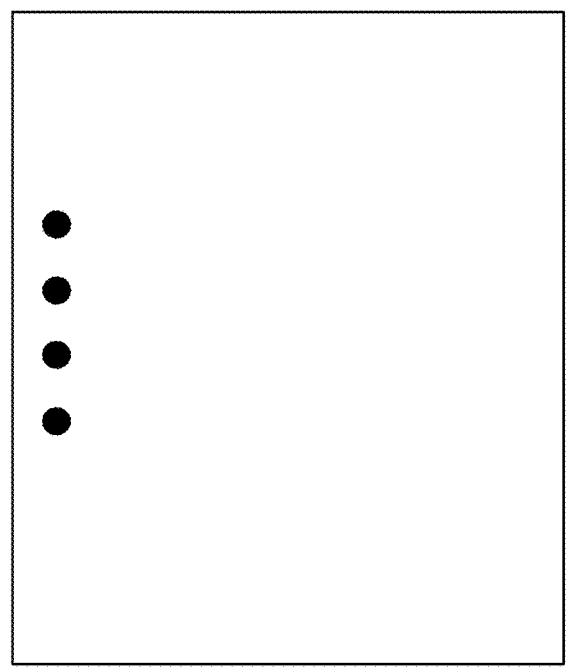
Figure 11:
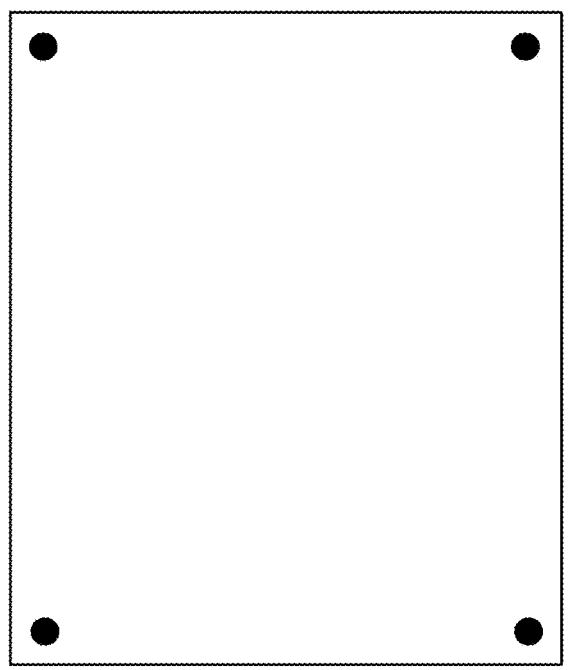

In the embodiment described above, the semiconductor device included 16 test pins 120 or test channels 140. However, it is understood that there may be more or less test pins/test channels in further embodiments, and they may be provided in a wide variety of other patterns in the semiconductor device 100. FIGS. 9-11 are top views showing a few additional examples of test pins 120. The test pins 120 shown in FIGS. 9-11 could alternatively be replaced by channels 140.

FIG. 9 illustrates an example including three test pins 120 spaced inward from the edges of the semiconductor device 100. While three test pins 120 are shown in FIG. 9, more or less than three pins may be provided spaced inward from the edges of the semiconductor device 100. FIG. 10 illustrates an example including for test pins 120 along a single edge of the semiconductor device 100. More or less test pins 120 may be provided along one, two, three or all four edges in further embodiments. FIG. 11 illustrates an example including for test pins 120 provided at the four corners of the semiconductor device 100. More than one test pin 120 may be provided in one or more of the corners in further embodiments.

Figure 12:
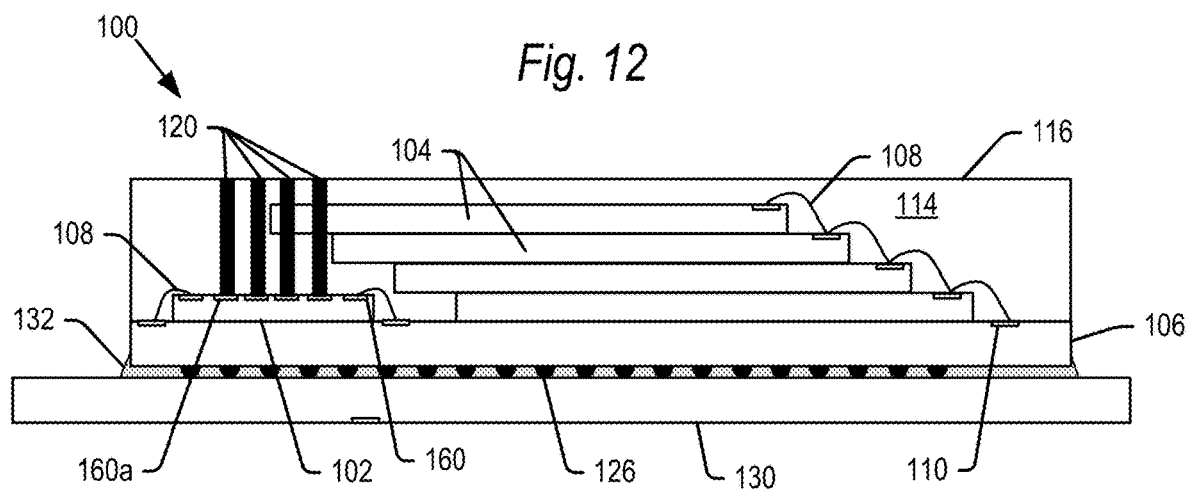
FIG. 12 is a side view showing a semiconductor device including debug features according to a further embodiment of the present technology.
Figure 13:
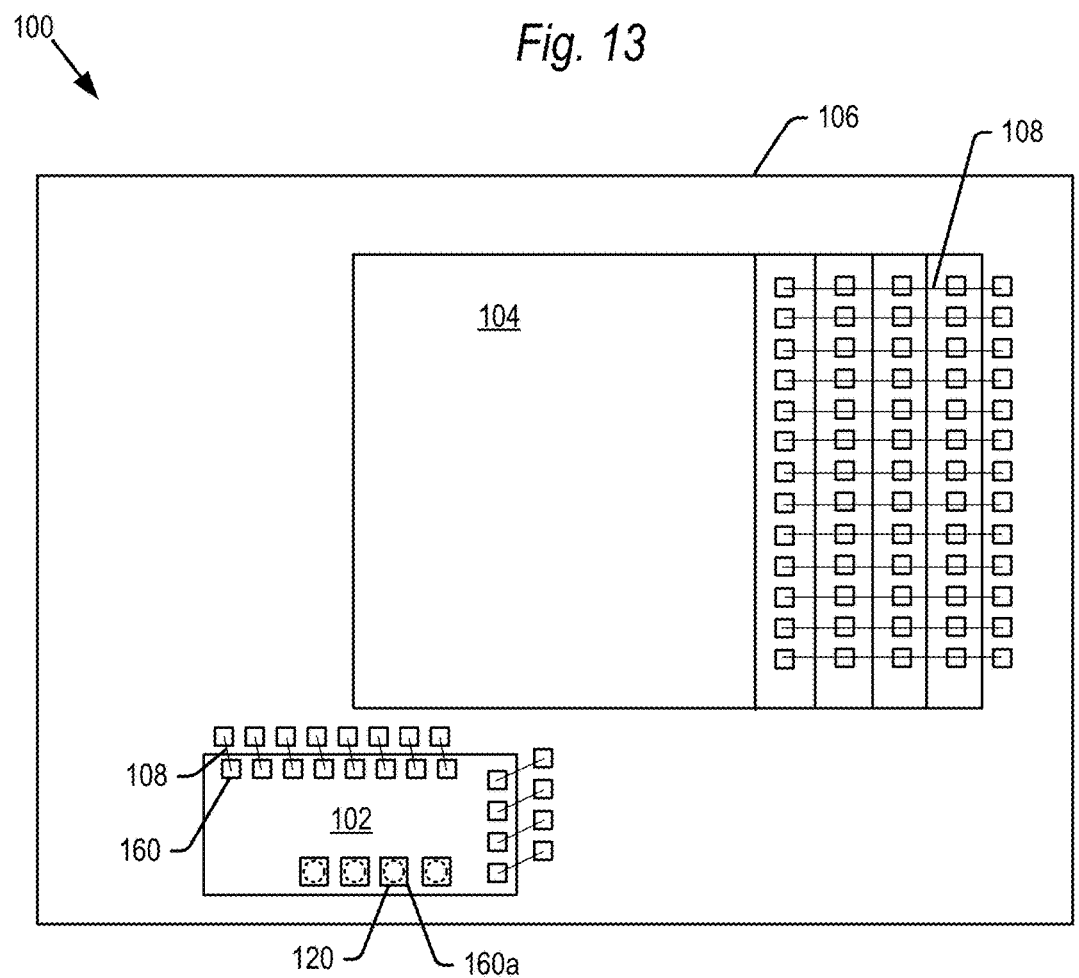
FIG. 13 is a top view of the semiconductor device of FIG. 12.

In the embodiments described above, the test pins 120 or channels 140 are provided through the housing 114 down to the substrate 106 on areas of the substrate 106 not including semiconductor dies 102, 104. FIGS. 12 and 13 illustrate side and top views of a further embodiment where the test pins 120 are routed straight down to die bond pads on controller die 102.

In this embodiment, the controller die 102 may include die bond pads 160 having test pads 160a. The positions of test pads 160a within the semiconductor device 100 are known. As such, test pins 120 may be formed through housing 116 as described above, and extend straight down on top of test pads 160a on controller die 102. In this embodiment, the test pads 110a on the substrate 106, and the traces 122 therefrom, may be omitted. The number and position of test pins 120 in the embodiment of FIGS. 12 and 13 is by way of example, and the number and position of test pins may vary in further embodiments. Channels 140 be substituted for test pins 120 in the embodiment of FIGS. 12 and 13.

In the embodiments described above, the through-package debug features including test pins 120 or channels 140 are coupled to one or more debug ports of the semiconductor die 102 to debug a fault condition on the semiconductor device 100 while the device 100 is affixed to a host device 130. In further embodiments, the debug features including test pins 120 and channels 140 may be used to test or debug a semiconductor device 100 before the device 100 is affixed to a host device, or while the semiconductor device 100 is otherwise separated from a host device. For example, after singulation and completion of the semiconductor device 100 in step 212, the device 100 may be tested for proper electrical operation using the test pins 120 or channels 140. The debug port of the semiconductor die may accordingly be used to debug the semiconductor device 100 or to test the semiconductor device 100.

In embodiments of the present technology, the test pins 120, channels 140 and/or test pads 110a are electrically coupled to the controller die 102. The test pads 120, channels 140 and/or pads 110a may alternatively be electrically coupled to the die 104. As noted above, the die 104 may for example be any of various memory dies, including flash memory dies and RAM.

In embodiments described above, the through-package debug features, including either the test pins 120 or channels 140, are formed down through the major planar surface 116 of the housing 114. In further embodiments, the through-package debug features may be formed through an edge of the housing between the surface 116 and the substrate. An example of such a surface is labeled at 136 in FIG. 2. In such embodiments, the test pins 120 or channels 140 may be provided at an oblique angle so as to angle down to the test pads 110a.

In summary, in one example, the present technology relates to a semiconductor device, comprising: a semiconductor die; a substrate including one or more test pads, the semiconductor die mounted on the substrate, the one or more test pads electrically coupled to one or more debug ports on the semiconductor die; a housing encasing the semiconductor die, the housing having a surface; one or more debug features having a first end at the surface of the housing and a second end terminating at the one or more test pads within the housing, the one or more debug features configured to receive a probe for debugging or testing the semiconductor device.

In another example, the present technology relates to a semiconductor device, comprising: a semiconductor die; a substrate including one or more test pads, the semiconductor die mounted within a keep-out area on the substrate, the one or more test pads electrically coupled to one or more debug ports on the semiconductor die; molding compound encasing the semiconductor die, the molding compound having a surface; one or more debug features formed through the molding compound, outside of the keep-out area, the one or more debug features having a first end at the surface of the molding compound and a second end in contact with the one or more test pads, the one or more debug features configured to receive a probe for debugging or testing the semiconductor device.

In a further example, the present technology relates to a method of debugging a semiconductor device mounted on a host device, the method comprising: (a) electrically coupling a probe with a test pad within the semiconductor device using a debug feature having a first end at a surface of the semiconductor device and a second end terminating at the test pad within the semiconductor device; (b) supplying test data to circuitry within the semiconductor device via the probe; and (c) measuring output data resulting from the test data.

In another example, the present technology relates to a semiconductor device, comprising: a semiconductor die; a substrate including one or more test pads, the semiconductor die mounted on the substrate, the one or more test pads electrically coupled to one or more debug ports on the semiconductor die; a housing encasing the semiconductor die, the housing having a surface; debugging means for allowing debugging or testing of the semiconductor device, the debugging means having a first end at the surface of the housing and a second end terminating at the one or more test pads within the housing.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A semiconductor device, comprising:
a plurality of semiconductor dies comprising one or more of a memory die and a controller die;
a substrate including a first surface and a second surface opposed to the first surface,
the substrate comprising one or more test pads on the first surface of the substrate, and one or more of the memory die and controller die mounted on the first surface of the substrate,
the one or more test pads electrically coupled to one or more debug ports on the one or more of the memory die and the controller die;
a housing encasing the one or more of the memory die and the controller die; and
one or more debug features having a first end spaced from the substrate on a surface of the housing and a second end terminating at the one or more test pads at the first surface of the substrate, the one or more debug features configured to receive a probe on the first end of the one or more debug features for debugging or testing the semiconductor device;
wherein the one or more debug features comprise one of:
i) vias filled or plated with a conductive material, and
ii) conductive columns soldered to the test pads.

2. The semiconductor device of claim 1, wherein the housing is comprised of a thermoplastic or thermosetting resin, the one or more debug features provided within one or more holes formed through the thermoplastic or thermosetting resin.

3. The semiconductor device of claim 1, wherein the one or more debug features are configured to receive the probe at the first end at the surface of the housing.

4. The semiconductor device of claim 1, wherein the one or more debug features are positioned at one or more edges of the surface of the housing.

5. The semiconductor device of claim 1, wherein the one or more debug features comprise multiple debug features at one or more edges of the housing.

6. The semiconductor device of claim 1, wherein the one or more debug features comprise one or more debug features at multiple edges of the housing.

7. The semiconductor device of claim 1, further comprising a plurality of solder balls on the second surface of the substrate, the solder balls configured to mount the semiconductor device on a host device.

8. A semiconductor device, comprising:
a plurality of semiconductor dies comprising one or more of a memory die and a controller die;
a substrate including first and second opposed surfaces, the substrate comprising one or more test pads on the first surface, and one or more of the memory die and controller die the semiconductor die mounted on the first surface of the substrate,
the one or more test pads electrically coupled to one or more debug ports on the one or more of the memory die and the controller die;
molding compound encasing the one or more of the memory die and the controller die;
one or more debug features formed through the molding compound, the one or more debug features having a first end formed through the molding compound and terminating at an external surface of the semiconductor device and a second end within the molding compound in contact with the one or more test pads on the first surface of the substrate, the one or more debug features configured to receive a probe on the first end of the one or more debug features for debugging or testing the semiconductor device;
wherein the one or more debug features are configured to receive the probe at the first end at the surface of the housing; and
wherein the one or more debug features comprise one of:
i) vias filled or plated with a conductive material, and
ii) conductive columns soldered to the test pads.

9. The semiconductor device of claim 8, wherein the one or more debug features are configured to receive the probe at the first end at the surface of the molding compound.

10. The semiconductor device of claim 9, wherein the one or more debug features comprise one or more test pins of conductive material terminating at the surface of the molding compound.

11. The semiconductor device of claim 8, wherein the one or more debug features are configured to receive the probe at the second end in contact with the one or more test pads.

12. The semiconductor device of claim 11, wherein the one or more debug features are one or more open channels through the housing.

13. A semiconductor device, comprising:
a plurality of semiconductor dies comprising one or more of a memory die and a controller die;
a substrate including first and second opposed surfaces, the substrate comprising one or more test pads on the first surface of the substrate, one or more of the memory die and controller die also mounted on the first surface of the substrate, the one or more test pads electrically coupled to one or more debug ports on the one or more of the memory die and the controller die;

a housing encasing the one or more of the memory die and the controller die;

debugging means for debugging or testing of the semiconductor device, the debugging means having a first end spaced from the substrate on an external surface of the semiconductor device and a second end terminating at the one or more test pads on the first surface of the substrate within the housing;

wherein the debugging means comprises one of: i) vias filled or plated with a conductive material, and ii) conductive columns soldered to the test pads.

* * * * *